United States Patent
Ramanathan et al.

(10) Patent No.: US 7,179,677 B2
(45) Date of Patent: Feb. 20, 2007

(54) ZNO/CU(INGA)SE$_2$ SOLAR CELLS PREPARED BY VAPOR PHASE ZN DOPING

(75) Inventors: Kannan Ramanathan, Golden, CO (US); Falah S. Hasoon, Golden, CO (US); Sarah E. Asher, Wheat Ridge, CO (US); James Dolan, Arvada, CO (US); James C. Keane, Lakewood, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/534,217

(22) PCT Filed: Sep. 3, 2003

(86) PCT No.: PCT/US03/27608

§ 371 (c)(1),
(2), (4) Date: May 6, 2005

(87) PCT Pub. No.: WO2005/034247

PCT Pub. Date: Apr. 14, 2005

(65) Prior Publication Data

US 2005/0257825 A1    Nov. 24, 2005

(51) Int. Cl.
*H01L 31/18*    (2006.01)

(52) U.S. Cl. .............................. 438/95; 438/93; 438/94; 136/262; 136/264; 136/265

(58) Field of Classification Search ................ 136/262, 136/264, 265; 438/93, 94, 95; 257/461, 257/431
See application file for complete search history.

(56) References Cited

U.S. PATENT DOCUMENTS 4,335,266 A    6/1982    Mickelsen et al.

(Continued)

FOREIGN PATENT DOCUMENTS

WO    WO 99/17377 A1 *    4/1999

OTHER PUBLICATIONS

Tomar, M.S. and Garcia, F.J., "A ZnO/p-CuInSe2 Thin Film Solar Cell Prepared Entirely by Spray Pyrolysis," Thin Solid Films, 90 (1982), pp. 419-423.

(Continued)

*Primary Examiner*—Nam Nguyen
*Assistant Examiner*—Anthony Fick
(74) *Attorney, Agent, or Firm*—Paul J. White

(57) ABSTRACT

A process for making a thin film ZnO/Cu(InGa)Se$_2$ solar cell without depositing a buffer layer and by Zn doping from a vapor phase, comprising: depositing Cu(InGa)Se$_2$ layer on a metal back contact deposited on a glass substrate; heating the Cu(InGa)Se$_2$ layer on the metal back contact on the glass substrate to a temperature range between about 100° C. to about 250° C.; subjecting the heated layer of Cu(InGa)Se$_2$ to an evaporant species from a Zn compound; and sputter depositing ZnO on the Zn compound evaporant species treated layer of Cu(InGa)Se$_2$.

11 Claims, 11 Drawing Sheets

U.S. PATENT DOCUMENTS

| | | | |
|---|---|---|---|
| 4,612,411 | A | 9/1986 | Weiting et al. |
| 4,687,725 | A * | 8/1987 | Wright et al. ............... 430/138 |
| 4,751,149 | A | 6/1988 | Vijayakumar et al. |
| 5,454,146 | A * | 10/1995 | Yagi et al. ................. 29/25.35 |
| 5,474,939 | A | 12/1995 | Pollock et al. |
| 5,990,416 | A | 11/1999 | Windisch, Jr. et al. |
| 6,040,521 | A | 3/2000 | Kushiya et al. |
| 6,346,184 | B1 | 2/2002 | Sano et al. |
| 6,355,874 | B1 | 3/2002 | Yagi et al. |
| 6,458,673 | B1 | 10/2002 | Cheung |
| 2002/0043279 | A1 | 4/2002 | Karg et al. |

OTHER PUBLICATIONS

"Chemical Vapor Deposited Copper Indium Diselenide Thin Film Materials Research" Final Report, Mar. 1984, SERI/STR-211-2247.

Terheggen et al., Ga2O3 segregation in Cu(In, Ga)Se2/ZnO superstrate solar cells and its impact on their photovoltaic properties.

Ramanathan et al., "Surface Treatment of CuInGaSe2 Thin Films and Its Effect on the Photovoltaic Properties of Solar Cells" In: National Renewable Energy Laboratory conference paper preprint. NREL: Colorado, Oct. 2002, pp. 1-6, especially p. 1.

Nishiwaki et al. Preparation of Zn Doped Cu(InGa)Se2 Thin Films by Physical Vapor Deposition for Solar Cells. Solar Energy Materials & Solar Cells. Jun. 1, 2003, vol. 77, No. 4, pp. 359-368, especially pp. 360-361.

Yamada et al. Buried pn Homojunction in Cu(InGa)Se2 solar cells formed by intentional Zn doping. In: Conference Record of the 28th Photovoltaic Specialists Conference. IEEE, Sep. 15-22, 2000, pp. 462-465, epecially p. 462.

Delahoy et al. Charging and Discharging of Defect States in CIGS/ZnO Junctions. Thin Solid Films. 2000, vol. 361-362, pp. 140-144, especially p. 361.

\* cited by examiner

ZNO/CU(INGA)SE$_2$ SOLAR CELLS PREPARED BY VAPOR PHASE ZN DOPING

CONTRACTUAL ORIGIN OF THE INVENTION

The United States Government has rights in this invention under Contract No. DE-AC3699GO10093 between the United States Department of Energy and the National Renewable Energy Laboratory, a division of the Midwest Research Institute.

TECHNICAL FIELD

The present invention relates to Zinc oxide/Copper Indium Gallium Selenium Disulfide solar cells characterized by conversion efficiencies of >11%. The cells are prepared by subjecting Copper Indium Gallium Disulfide (CuInGaSe$_2$) or CIGS thin films to evaporant species from zinc acetate dihydrate at varying substrate temperatures, and sputter depositing ZnO thereon to provide a transparent electrode for the cell. The innovation of the invention constitutes a basis for in-line junction fabrication processes for preparing CIGS thin films that do not require the use of a Cd compound and requires no buffer layers.

BACKGROUND ART

Processes for manufacture of high light to electrical energy conversion efficiency thin film photovoltaic cells are known to utilize a first layer of copper indium diselenide in heterojunction with one or more layers of cadmium sulfide.

For example, U.S. Pat. No. 4,335,266 discloses a method for forming a copper indium diselenide layer in two distinct regions, wherein the first region contains an excess of copper and the second region is copper deficient. Diffusion between the two layers achieves a uniform copper indium diselenide structure to reduce the formation of pure copper nodules near the copper indium diselenide surface where the cadmium sulfide layer is to be deposited. However, despite the improvements in the copper indium diselenide layer, it has still been found necessary to deposit a cadmium sulfide layer to achieve high efficiency.

"While various improvements have been made in the manufacture of copper indium diselenide CdS cells, several complications remain. For example, chemical bath deposition of cadmium sulfide is used to produce the highest efficiency devices. However, this step involves a slow wet chemical step inconsistent with an otherwise in-line dry fabrication process. Moreover, cadmium and thiourea are highly toxic materials which escalate manufacturing costs as a result of the handling and disposal of these hazardous waste materals".

Several attempts to avoid handling complications inherent in the use of CdS are disclosed in "A ZnO/p-CuInSe$_2$ Thin Film Solar Cell Prepared Entirely by Spray Pyrolysis," M. S. Tomar and F. J. Garcia, Thin Solids Films, 90 (1982). p. 419–423; and "Chemical Vapor Deposited Copper Indium Diselenide Thin Film Materials Research" Final Report, March 1984, SERI/STR-211-2247. Although these publications disclose copper indium diselenide/zinc oxide heterojunction formation using zinc oxide spray pyrolysis or ion beam sputtering respectively, neither method results in an efficiency of greater than 2–3%. Accordingly, these publications do not disclose a commercially viable method for the replacement of CdS with zinc oxide in a thin film copper indium diselenide heterojunction cell.

U.S. Pat. No. 4,612,411, describes the preparation of a thin film heterojunction photovoltaic cell formed from copper indium diselenide, as a first semiconductor layer, and the formation of a two layer, zinc oxide semiconductor in heterojunction with the copper indium diselenide. The first of the two zinc oxide layers comprises a relatively thin layer (100–2000 angstroms) of high resistivity zinc oxide and the second comprises a relatively thick (10,000 angstroms) zinc oxide layer doped to exhibit low resistivity.

U.S. Pat. No. 5,474,939, produces a higher efficiency non-CdS cell through the application of a wet chemical deposition zinc hydroxide precipitation step. This process involves the use of a metal back contact having a first p-type semiconductor film of chemical vapor deposition ("CVD") copper indium diselenide and a second transparent n-type semiconductor film of CVD zinc oxide on the copper indium diselenide and a thin interfacial film of transparent insulating zinc oxide, between the p-type copper indium diselenide film and the n-type zinc oxide. The interfacial zinc oxide film is prepared by chemical deposition of zinc hydroxide on the copper indium diselenide from a zinc salt solution and complexing agents comprising ammonium hydroxide or triethanolamine, to form a zinc ammonium solution complex, and annealing the deposit to covert the zinc hydroxide into the zinc oxide. While this patent uses a wet chemical deposition step of zinc hydroxide precipitate from solution to generate a thin interfacial zinc oxide layer, the devices prepared by direct deposition of a zinc oxide layer, the devices prepared by direct deposition of a zinc oxide layer on copper indium diselenide films are only 2–4% conversion efficient in spite of utilizing films capable of producing 15–17% cells.

Accordingly, there is a need in the art to obtain copper indium gallium diselenide thin film photovoltaic cells characterized by high conversion efficiency without incurring the disadvantages of: utilzing a CdS layer via wet chemistry; utilizing slow, batch processes; employing the highly toxic material of Cd, which escalates manufacturing costs as a result of handling and disposal of this hazardous waste; incurring a reduction in collected current; and forming junctions at 60–80° C.

DISCLOSURE OF THE INVENTION

One object of the present invention is to provide an improved process for making CuInGaSe$_2$ thin film solar cells characterized by conversion efficiencies greater than about 11%, and yet avoid the need to deposit a buffer layer.

Another object of the present invention is to provide a process for preparing CuInGaSe$_2$ thin film solar cells characterized by conversion efficiencies greater than about 11% by subjecting CuInGaSe$_2$ thin films to an evaporant species from zinc acetate dihydrate to dope the surface region n-type.

Other objects and advantages of the invention will become apparent from the drawings and detailed description of the preferred embodiment of the invention hereafter described.

DETAILED DESCRIPTION OF PREFERRED EMBODIMENT OF INVENTION

It is known that Cd and Zn have a profound influence in creating efficient photovoltaic junctions in CuInSe$_2$ (CIS) thin films since 11% cells can be fabricated in CIS thin films with Cd and Zn. On the other hand, with CuInGaSe$_2$ thin films, 15.7% cells have been produced using Cd and 14.2% cells have been produced using Zn. By the use of a non-aqueous method to diffuse Zn a cell with 13.5% efficiency is produced.

With demand mounting in the thin film photovoltaic industry, CIS cells can benefit greatly from a simple, quick, in-line process for doping and junction-formation. The present invention process meets this demand in that hot CIGS is cooled to about 200° C., and made to enter a doping zone wherein it is exposed to an evaporant species of ZnAc$_2$.2H$_2$O or its equivalents, and exits to the transparent conducting oxide (TCO) deposition of ZnO by sputtering.

Equivalents of zinc acetate dihydrate in the context of the invention process are zinc chloride, zinc iodide, and zinc bromide. Further, cadmium chloride, cadmium iodide, and cadmium bromide will produce effects similar to that of the aforementioned zinc compounds.

In the vapor phase and n-type doping and junction formation of CuInGaSe$_2$ thin film CIGS cells of the invention, the CIGS thin films were subjected to an evaporant species from zinc acetate dihydrate at various substrate temperatures. The samples were etched in acetic acid and solar cells were completed by the sputter deposition of ZnO to obtain cells as high as ~11% efficiency for the case of 200° C. and this is a marked improvement compared to the 1.8% efficiency for the case of no-vapor phase ZnO sputter deposition treatment. As a consequence, a non-Cd, in-line junction fabrication process for CIGS is now available for the photovoltaic industry.

EXAMPLE

A co-evaporated CIGS film was divided into four parts, 2"×1" in length and loaded into a chamber along with a Mo/glass substrate. Zinc acetate dihydrate solid was loaded in a Mo boat. A thermocouple touching the back side of the CIGS substrate was used to control the temperature (Tglass).

The zinc acetate dihydrate source temperature was raised slowly and the charge was evaporated slowly, while the substrate is brought to the desired temperature before the evaporation is started. The substrate was exposed during the entire time. The exposure time was not controlled, and the evaporation lasted for about 2 to about 4 minutes. The samples were removed and etched in acetic acid in an amount of about 50% by volume in water to remove the ZnO deposit. Sputtered ZnO was deposited next in MRC.

Figure 1:
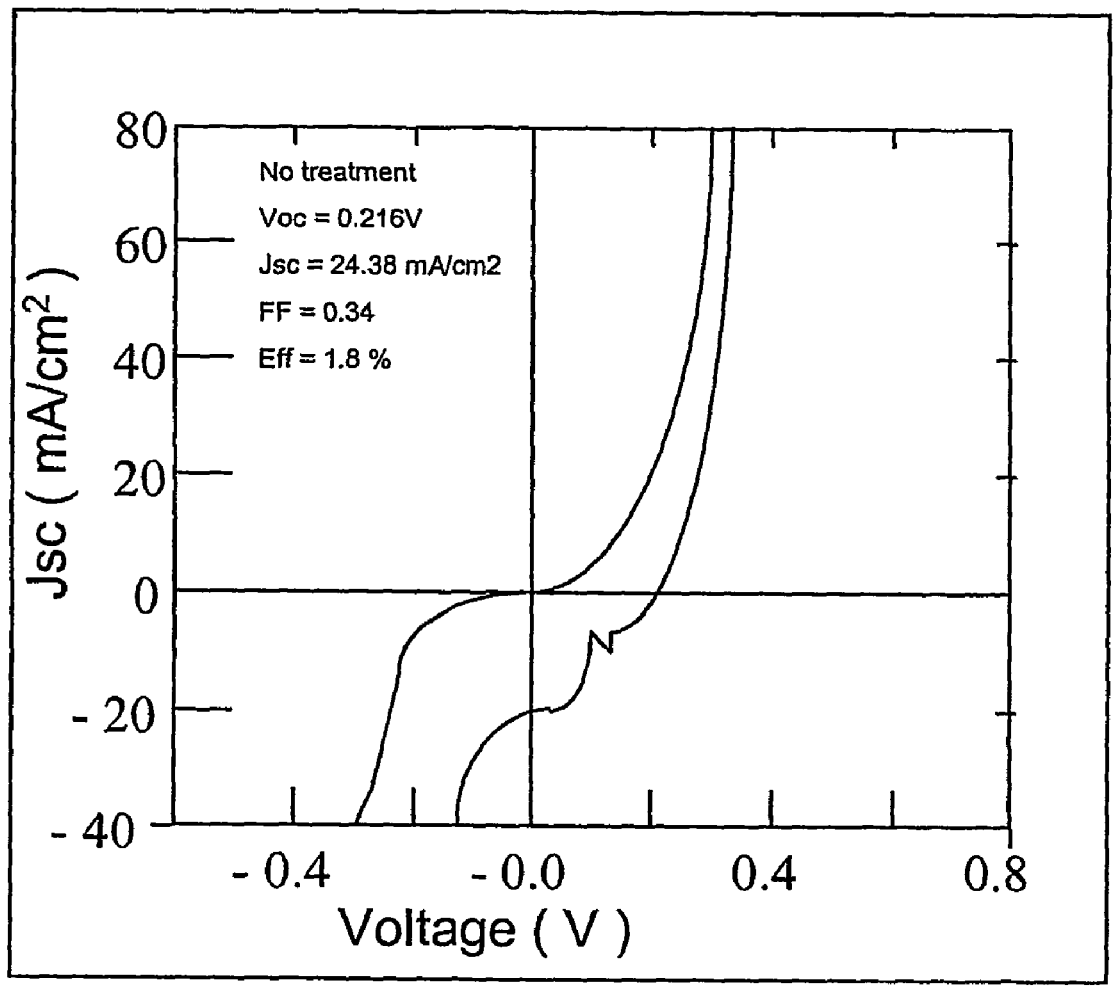
FIG. 1 is a graph showing current density versus voltage for a CuInGaSe$_2$ (CIGS) thin film or diode that was not subjected to an evaporant species of zinc acetate dihydrate and on which ZnO was sputter deposited.

The graph of FIG. 1 shows a weak diode in the case of no treatment in accordance with the invention process.

Figure 2:
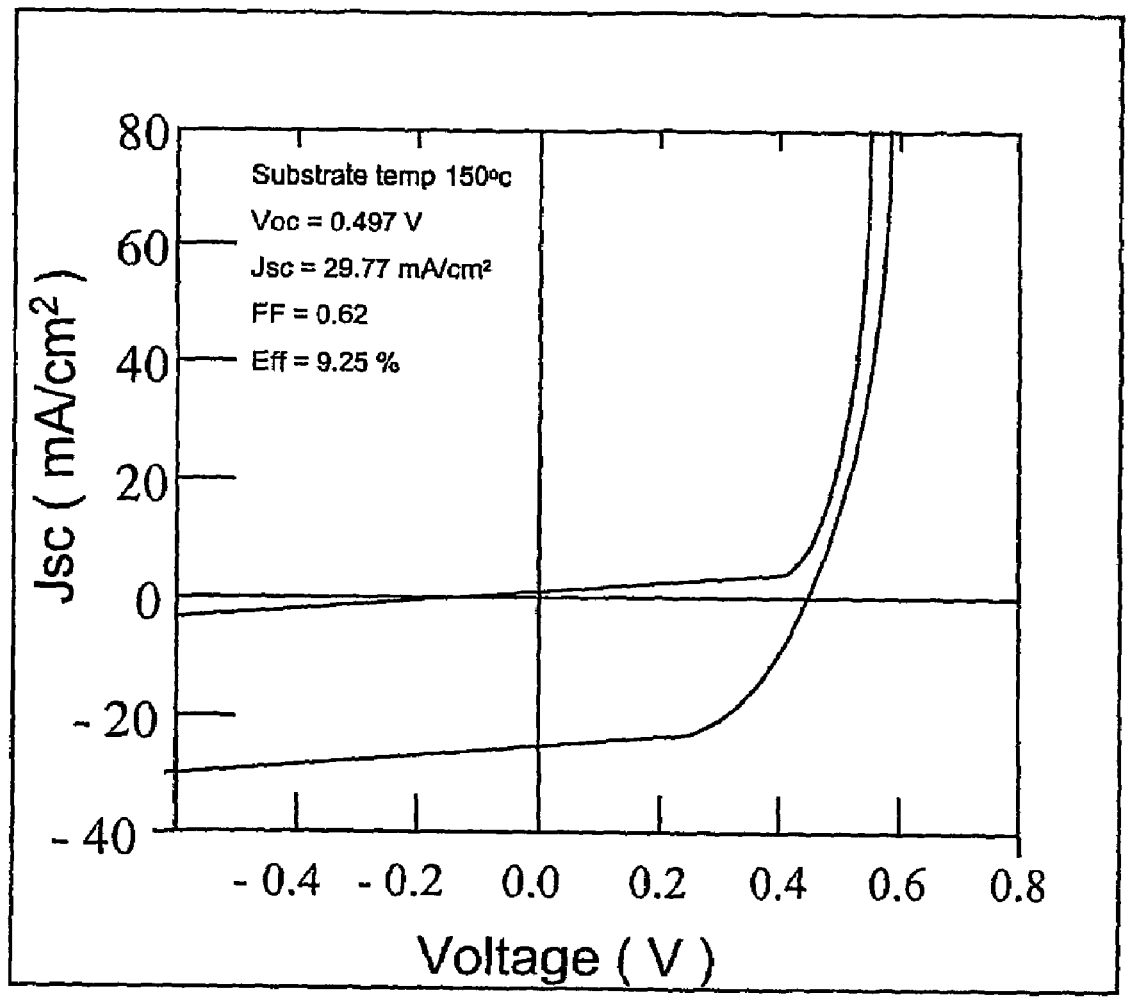
FIG. 2 is a graph showing current density versus voltage for a CIGS thin film subjected to an evaporant species of zinc acetate dihydrate at a substrate temperature or Tg of 150° C., followed by sputter depositing ZnO.
Figure 3:
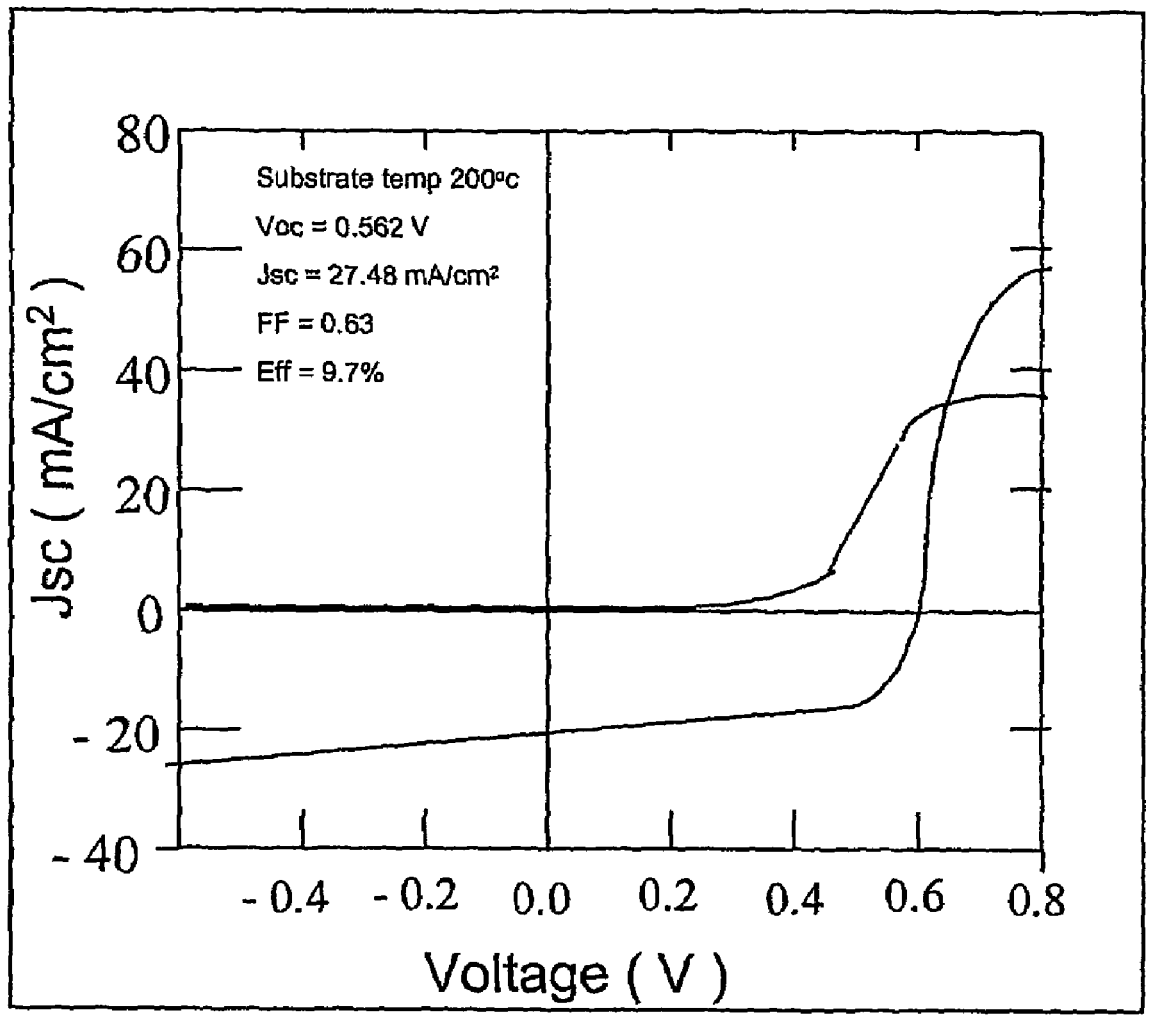
FIG. 3 is a graph showing current density versus voltage for a CIGS thin film subjected to an evaporant species of zinc acetate dihydrate at a substrate temperature or Tg of 200° C., followed by sputter depositing ZnO.

In FIG. 2 where Tg=150° C., and was treated in accordance with the invention process, the sample had a dark brown coating, and showed deposition of ~30 nm ZnO or Zn(OH)$_2$ film. For Tg=200° C. and 250° C., as shown respectively in the graphs of FIGS. 3 and 4, no clear change in color was observed. All the samples were etched in acetic acid.

In the case where the Tg=150° C., a clear improvement is observed, and the Jsc is in the expected range. Further, there is >60% fill factor, and this is an indication that the process is satisfactory. The Voc is nearly 0.5V, and this is again in the range for non-CdS cells as >9% efficiency is obtained.

For Tg=200° C., the Voc is 0.562V, and the fill factor is 0.63. These are satisfactory numbers. The typical Voc's for aqueous Cd photoelectric treated cells are about 0.6V, and fill factors are about 0.65–0.7. The diode formed functions satisfactorily in darkness and light. A reaction at the surface of the CIGS is raising the potential barrier (spike) and limiting the current flow; however the absorber is likely compensated, as (p is reduced by Zn donors). The cross over is indicative of defects changing occupancy under illumination (trapping).

Figure 4:
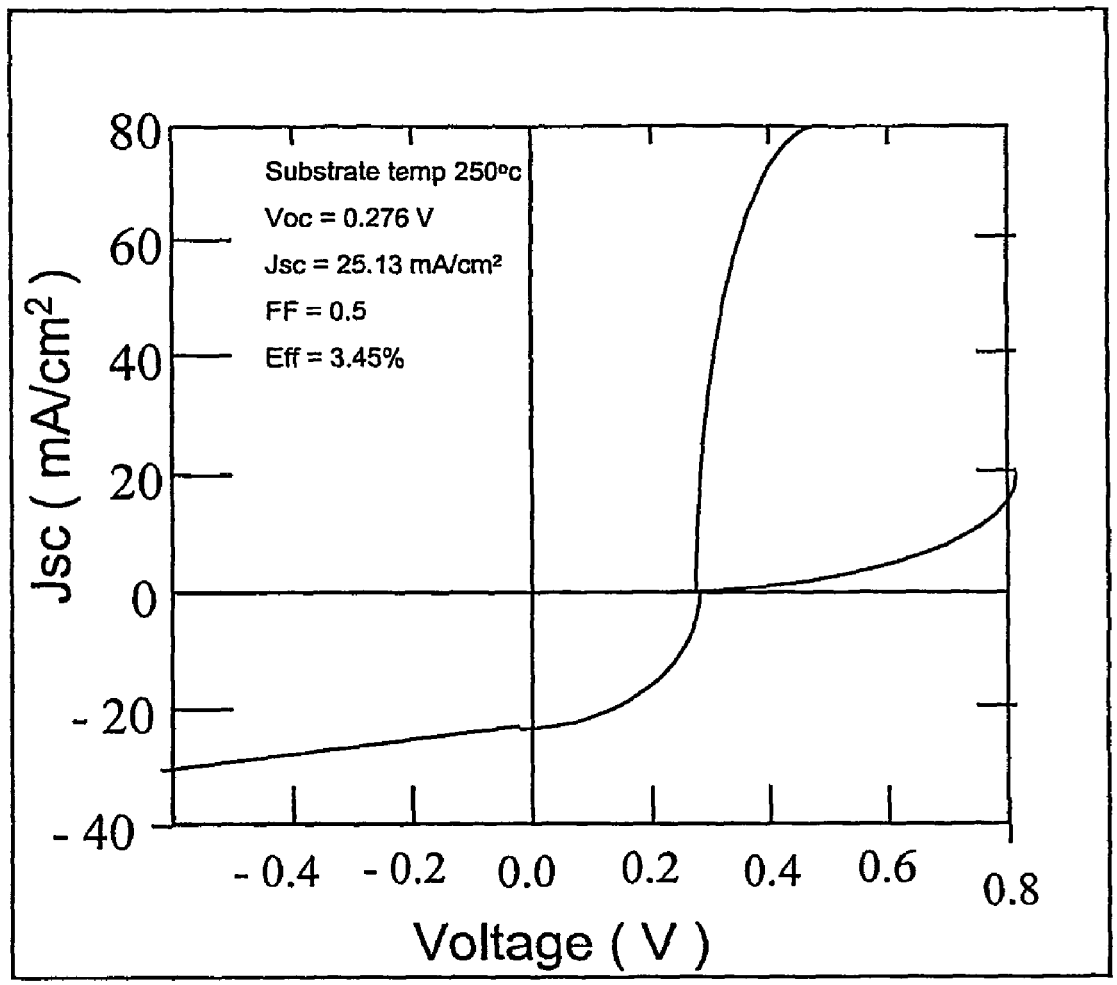
FIG. 4 is a graph of current density versus voltage for a CIGS thin film subjected to an evaporant species of zinc acetate dihydrate at a substrate temperature or Tg of 250° C., followed by sputter depositing ZnO.

For Tg=250° C., as shown in FIG. 4, these problems become worse. The absorber is now semi-insulating due to excessive compensation. There is a similar trend with CdS/CIGS as a function of post heating.

Figure 5:
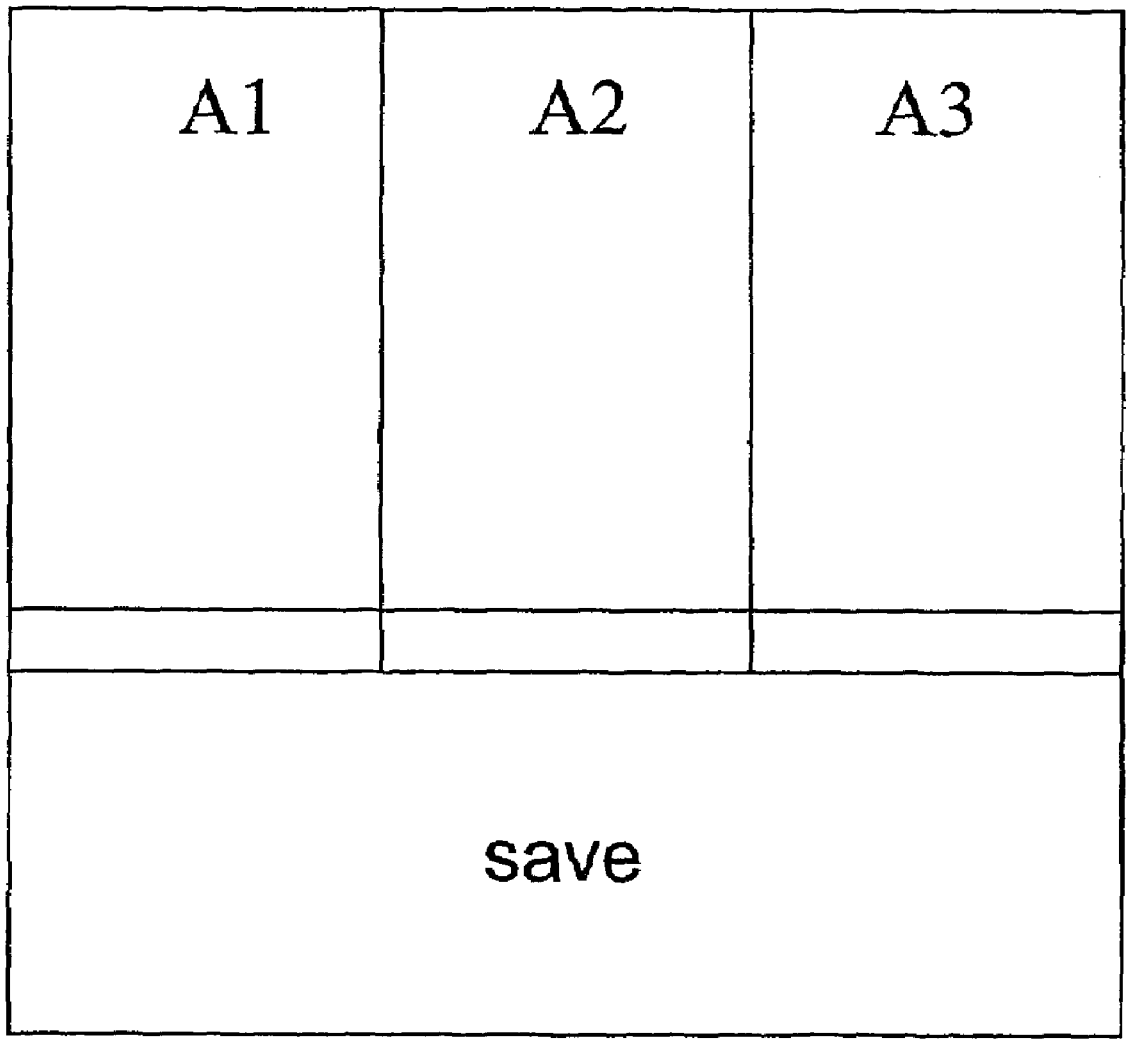
FIG. 5 is a CIGS film on Mo/glass cut into three 2"×1" samples (A1, A2 and A3) and a blank, wherein one CIGS sample and a blank is used in each run of the invention process, and the blank is saved as the bottom third.

FIG. 5 is a CIGS film on Mo/glass cut into three 2"×1" samples (A1, A2 and A3) and a blank, wherein one CIGS sample and a blank is used in each run of the invention process, and the blank is saved as the bottom third.

Figure 6:
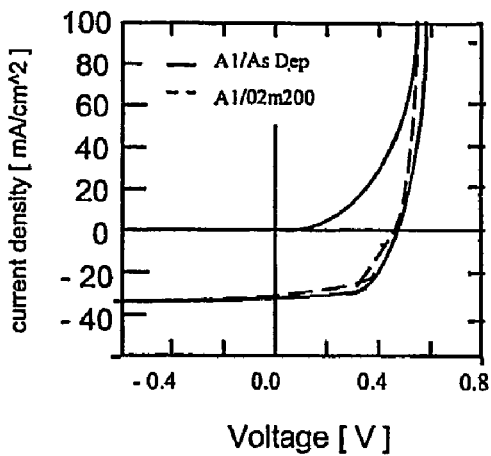
FIGS. 6A THROUGH 6G are graphs showing dark and light I-V curves for the 7 cells shown on a substrate 1×1.5 in$^2$. The film were subjected to evaporant species from zinc acetate dihydrate at 150° C., followed by sputter deposition of ZnO. Each figure is for one cell, and the two lines are for dark and light I-V.
FIG. 6H shows a quantum efficiency curve of relative external quantum efficiency (QE) versus wavelength for the ZnO/CIGS cells of FIG. 6 prepared by the Zn vapor phase doping of the invention process.
Figure 6:
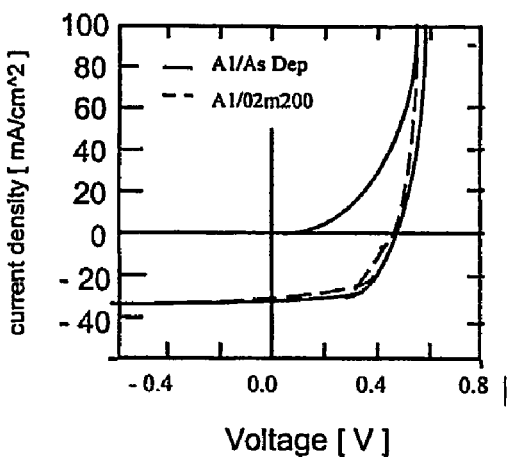
Figure 6:
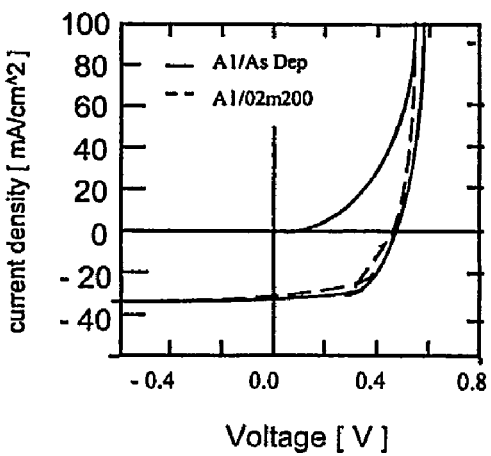
Figure 6:
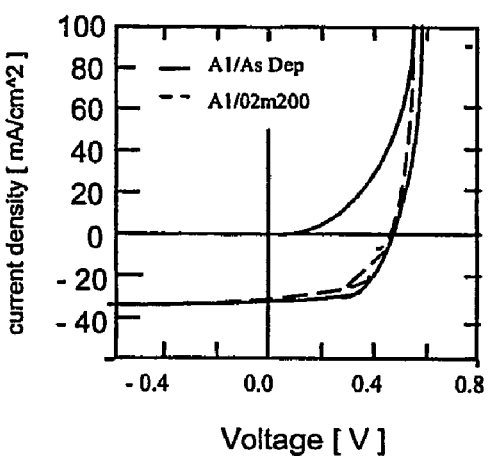
Figure 6:
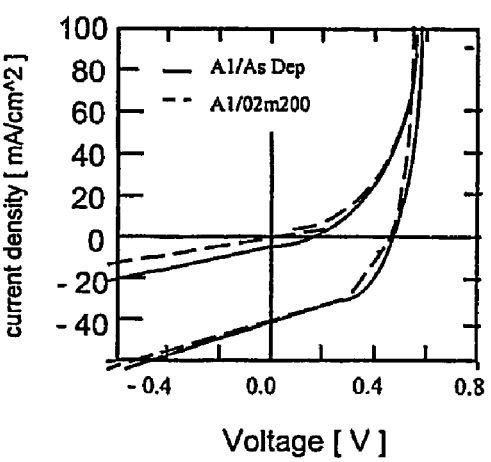
Figure 6:
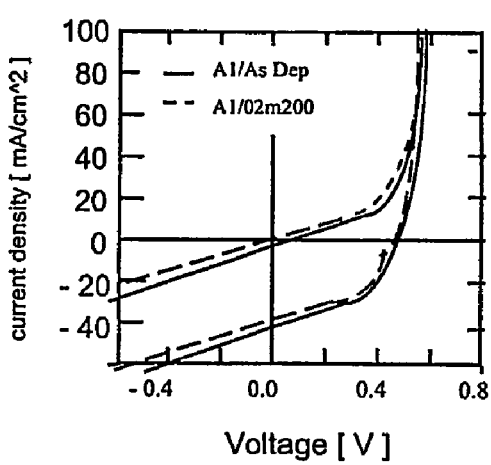
Figure 6:
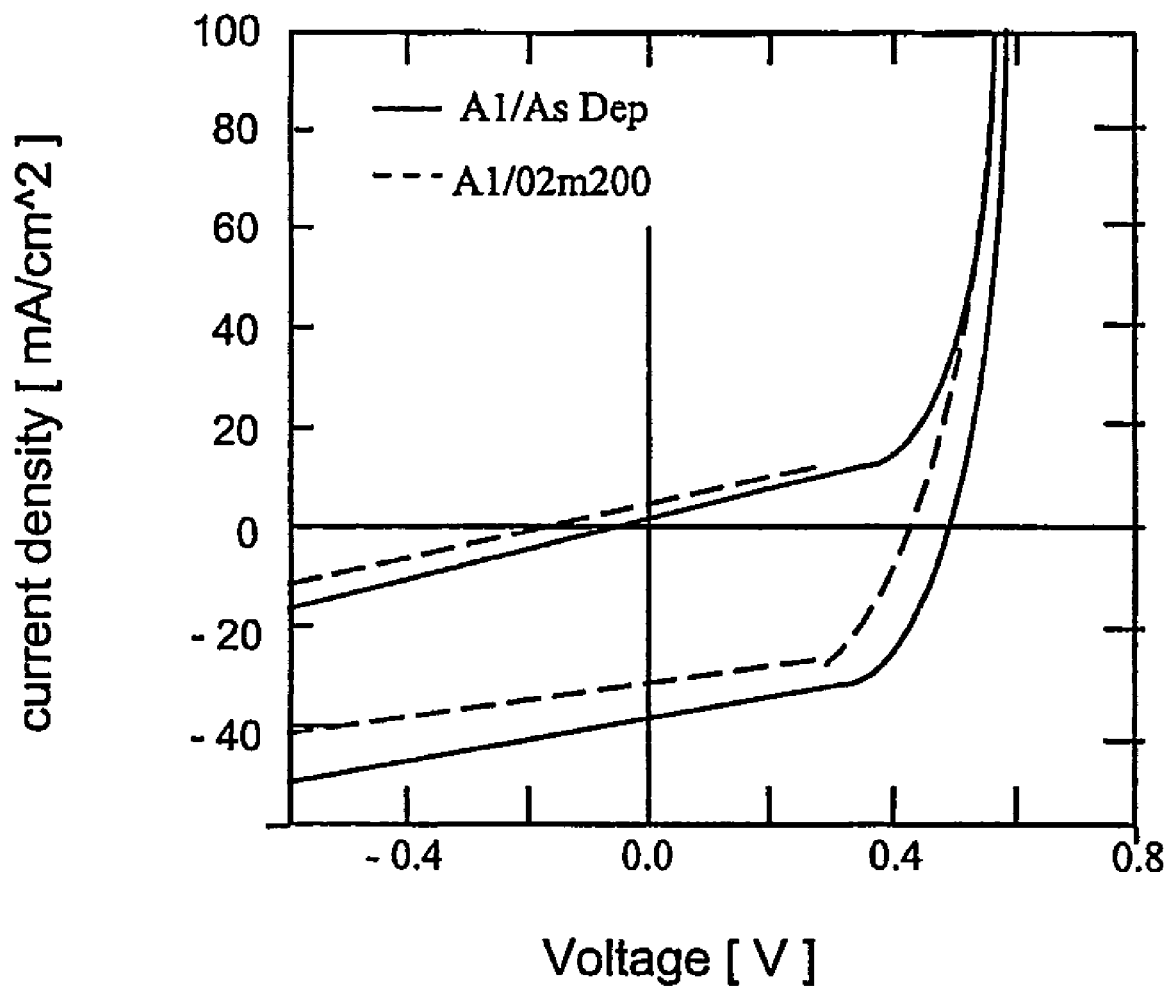

FIG. 6 is a graph showing dark and light I-V curves for the 7 cells shown on a substrate 1×1.5 in$^2$ shown in FIGS. 6A thru 6G. The film were subjected to evaporant species from zinc acetate dihydrate at 150° C., followed by sputter deposition of ZnO. Each figure is for one cell, and the two lines are for dark and light I-V.

Figure 6H:
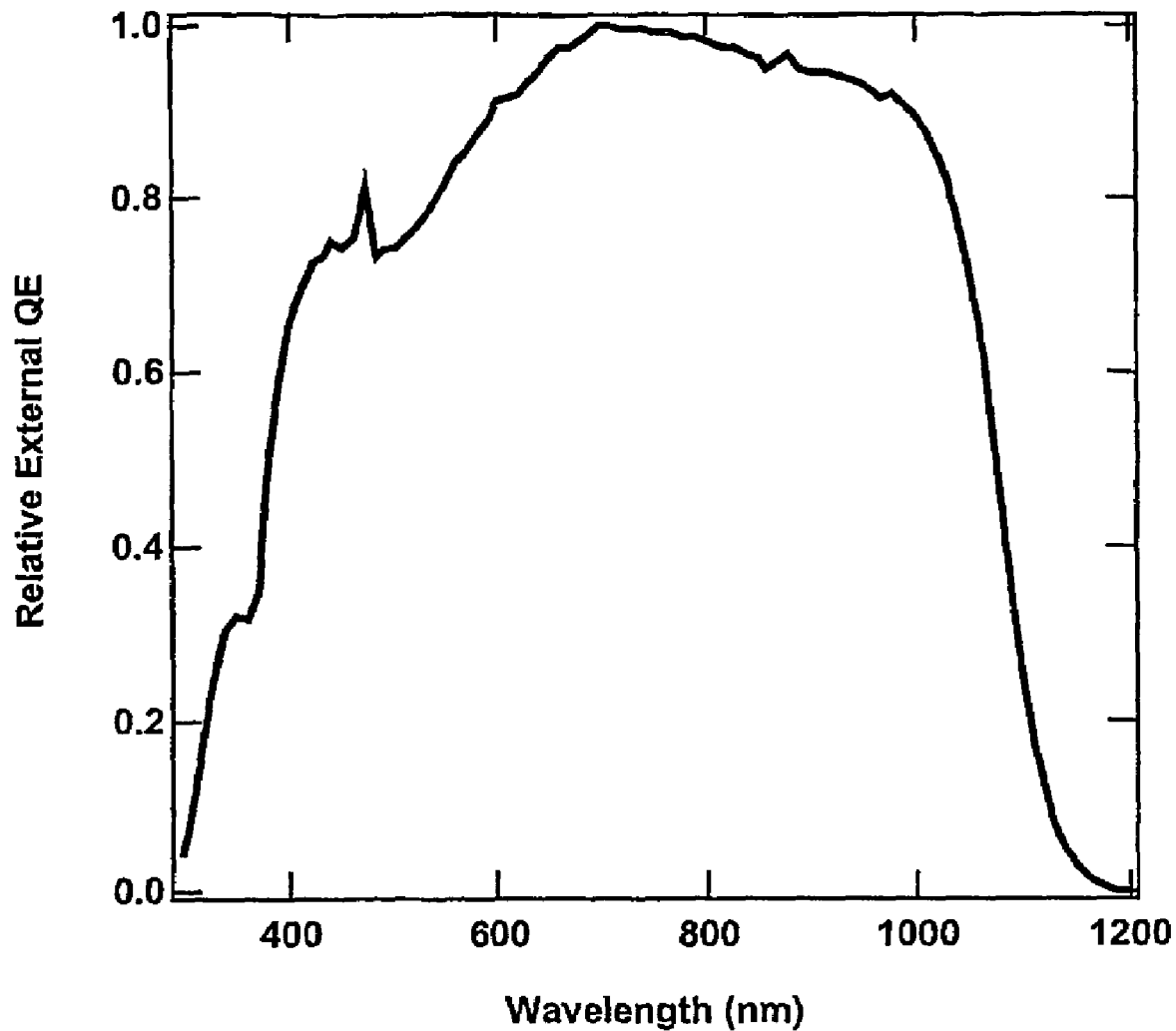
Figure 7A:
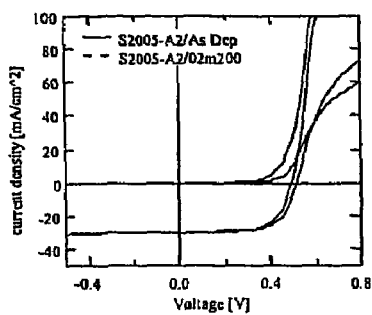
FIGS. 7A through 7G are graphs showing two sets of I-V curves for a string of seven cells adjacent to each other on a single substrate, one for dark and the other for light, 1×1.5 in$^2$. The broken lines are I-V curves taken after the cells are annealed in air at 200° C. for 2 minutes. The CIGS absorber was exposed to evaporant zinc acetate dehydrate at a substrate temperature of 100° C., and heated to 200° C. for 30 minutes.
Figure 7D:
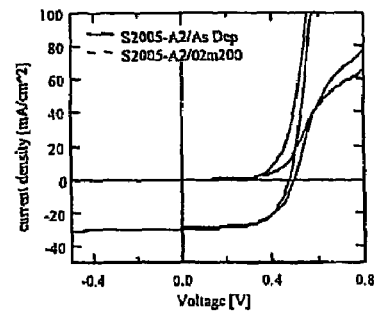
Figure 7B:
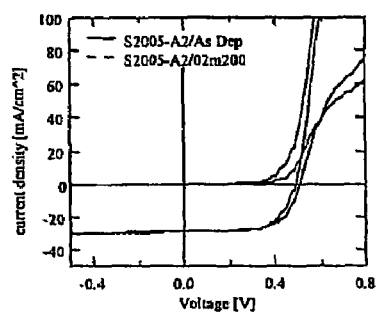
Figure 7E:
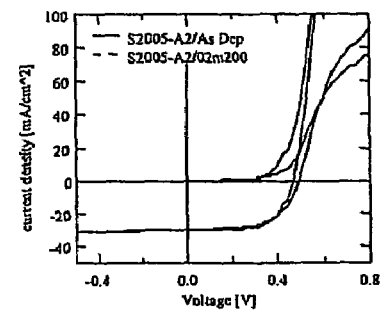
Figure 7C:
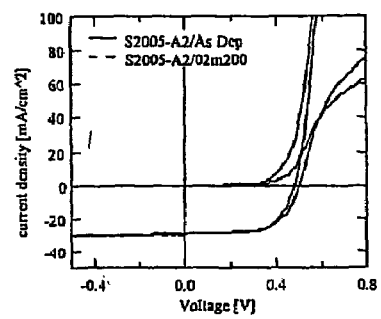
Figure 7F:
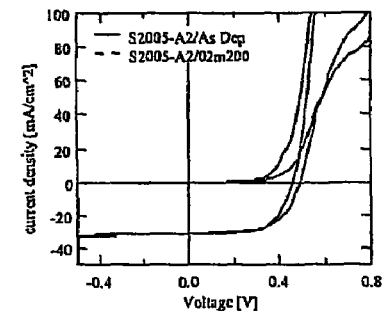
Figure 7G:
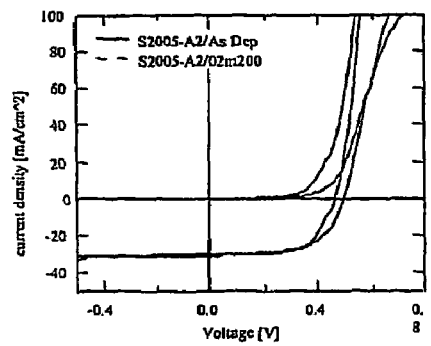
Figure 8A:
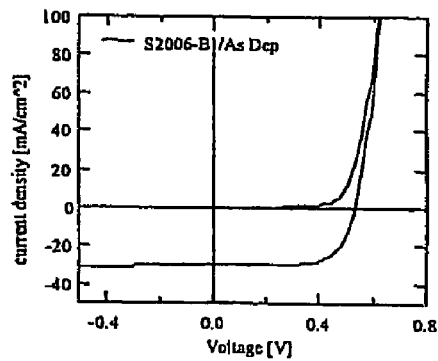
FIGS. 8A through 8F are graphs showing I-V curves of the distribution of efficiency for multiple cells on a single substrate, wherein the CIGS sample was exposed to evaporant species from zinc acetate dehydrate at a substrate temperature of 200° C. and the ZnO layer was deposited by sputtering. There are many cells with an efficiency of 11%, and the best cell had an efficiency of 12.6%.
Figure 8D:
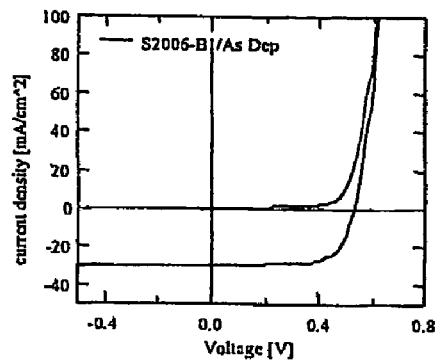
Figure 8B:
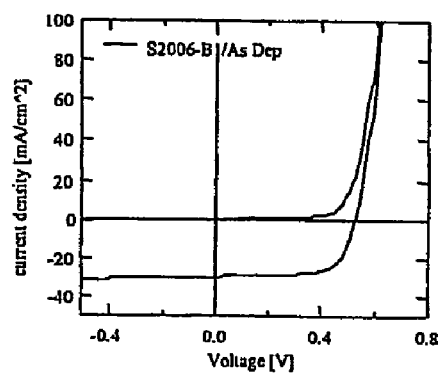
Figure 8E:
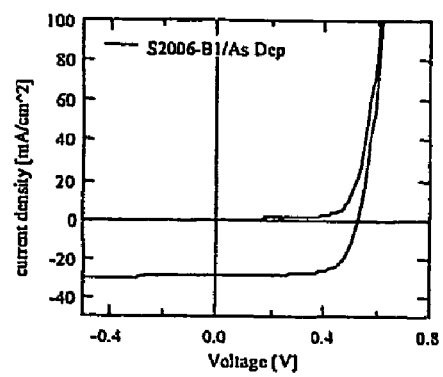
Figure 8C:
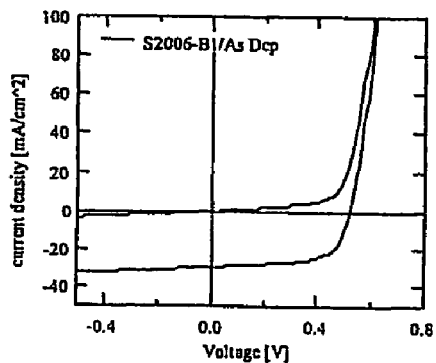
Figure 8F:
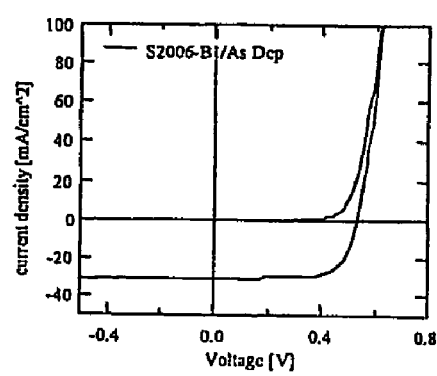

FIG. 6H shows a quantum efficiency curve of relative external quantum efficiency (QE) versus wavelength for the ZnO/CIGS cells of FIG. 6 prepared by the Zn vapor phase doping of the present invention process.

FIGS. 7A through 7G are graphs showing two sets of I-V curves for a string of seven for cells adjacent to each other on a single substrate, one for dark and the other for light, $1 \times 1.5$ in$^2$. The broken lines are I-V curves taken after the cells are annealed in air at 200° C. for 2 minutes. The CIGS absorber was exposed to evaporant zinc acetate dehydrate at a substrate temperature of 100° C., and heated to 200° C. for 30 minutes. The data for the two sets of curves are shown below:

of 13.1%, an open current voltage of 0.627V, a current density of 32.8 mA/cm$^2$, and a fill factor of 64%.

As a result of these tests, it seems apparent from these cells that several issues are significant:

1. It appears useful to characterize the ZnO (Zn(OH)$_2$) deposit by XRD;
2. It may be useful to utilize a high efficiency, well characterized absorber;
3. It may be useful to use a shutter and control the exposure time;
4. It may be useful to evaporate zinc acetate on CIGS that is not heated, and post annealing appears useful to induce diffusion and doping;
5. It may be useful to either keep the ZnO on or remove it; and

| Cell | Process | Area (cm$^2$) | Voc (V) | Jsc (mA/cm$^2$) | Isc (mA) | FF (%) | Eff (%) | Vmp (V) | Imp (mA) | Pmax (mW) | Rso (Ω·cm) | Rsho (Ω·cm) |
|---|---|---|---|---|---|---|---|---|---|---|---|---|
| 1 | As dep | 0.430 | 0.490 | −30.32 | −13.039 | 65.61 | 9.751 | 0.369 | −26.45 | 9.751 | 2.718 | 673.9 |
| 2 | As dep | 0.430 | 0.487 | −29.43 | −12.655 | 65.49 | 9.385 | 0.365 | −25.72 | 9.385 | 2.559 | 717.5 |
| 3 | As dep | 0.430 | 0.479 | −29.55 | −12.708 | 64.75 | 9.161 | 0.359 | −25.55 | 9.161 | 2.149 | 523.1 |
| 4 | As dep | 0.430 | 0.474 | −29.90 | −12.859 | 64.67 | 9.161 | 0.353 | −25.93 | 9.161 | 2.752 | 622.0 |
| 5 | As dep | 0.430 | 0.465 | −30.47 | −13.100 | 65.17 | 9.230 | 0.350 | −26.35 | 9.230 | 1.920 | 566.5 |
| 6 | As dep | 0.430 | 0.460 | −31.46 | −13.529 | 64.39 | 9.320 | 0.345 | −27.02 | 9.320 | 2.411 | 562.4 |
| 7 | As dep | 0.430 | 0.458 | −30.85 | −13.265 | 63.61 | 8.986 | 0.337 | −26.69 | 8.986 | 2.044 | 539.8 |

| Cell | Process | Area (cm$^2$) | Voc (V) | Jsc (mA/cm$^2$) | Isc (mA) | FF (%) | Eff (%) | Vmp (V) | Imp (mA) | Pmax (mW) | Rso (Ω·cm) | Rsh (Ω·cm) |
|---|---|---|---|---|---|---|---|---|---|---|---|---|
| 1 | As dep | 0.430 | 0.490 | −30.32 | −13.039 | 65.61 | 9.751 | 0.369 | −26.45 | 9.751 | 2.718 | 673.9 |
| 2 | As dep | 0.430 | 0.487 | −29.43 | −12.655 | 65.49 | 9.385 | 0.365 | −25.72 | 9.385 | 2.559 | 717.5 |
| 3 | As dep | 0.430 | 0.479 | −29.55 | −12.708 | 64.75 | 9.161 | 0.359 | −25.55 | 9.161 | 2.149 | 523.1 |
| 4 | As dep | 0.430 | 0.474 | −29.90 | −12.859 | 64.67 | 9.161 | 0.353 | −25.93 | 9.161 | 2.752 | 622.0 |
| 5 | As dep | 0.430 | 0.465 | −30.47 | −13.100 | 65.17 | 9.230 | 0.350 | −26.35 | 9.230 | 1.920 | 566.5 |
| 6 | As dep | 0.430 | 0.460 | −31.46 | −13.529 | 64.39 | 9.320 | 0.345 | −27.02 | 9.320 | 2.411 | 562.4 |
| 7 | As dep | 0.430 | 0.458 | −30.85 | −13.265 | 63.61 | 8.986 | 0.337 | −26.69 | 8.986 | 2.044 | 539.8 |
| 1 | 02m200 | 0.430 | 0.513 | −29.96 | −12.883 | 67.27 | 10.349 | 0.395 | −26.20 | 10.349 | 2.441 | 402.6 |
| 2 | 02m200 | 0.430 | 0.508 | −29.08 | −12.504 | 65.86 | 9.732 | 0.383 | −25.39 | 9.732 | 2.498 | 507.0 |
| 3 | 02m200 | 0.430 | 0.501 | −29.20 | −12.555 | 63.24 | 9.246 | 0.373 | −24.76 | 9.246 | 2.717 | 349.8 |
| 4 | 02m200 | 0.430 | 0.496 | −29.51 | −12.689 | 60.57 | 8.856 | 0.369 | −24.02 | 8.856 | 2.756 | 319.5 |
| 5 | 02m200 | 0.430 | 0.492 | −30.00 | −12.902 | 60.05 | 8.856 | 0.363 | −24.37 | 8.856 | 2.742 | 271.5 |
| 6 | 02m200 | 0.430 | 0.492 | −31.06 | −13.355 | 61.61 | 9.424 | 0.363 | −25.94 | 9.424 | 2.582 | 331.9 |
| 7 | 02m200 | 0.430 | 0.491 | −30.22 | −12.993 | 62.36 | 9.255 | 0.369 | −25.11 | 9.255 | 2.482 | 283.4 |

FIGS. 8A through 8F are graphs showing I-V curves of the distribution of efficiency for multiple cells on a single substrate, wherein the CIGS sample was exposed to evaporant species from zinc acetate dehydrate at a substrate temperature of 200° C. and the ZnO layer was deposited by sputtering. There are many cells with an efficiency of 11%, and the best cell had an efficiency of 12.6%. The data for these two sets of curves are shown below:

6. It may be useful to wash the CIGS in water or dilute NH$_4$OH before deposition to remove surface alkali impurities.

That a simple evaporation process of a Zn species, that may be zinc acetate dihydrate for vapor phase, extrinsic n-type doping of CIGS thin films can achieve at least 11% conversion efficiency in CIGS cells is apparent from the J-V data which follows.

| Cell | Process | Area (cm$^2$) | Voc (V) | Jsc (mA/cm$^2$) | Isc (mA) | FF (%) | Eff (%) | Vmp (V) | Imp (mA) | Pmax (mW) | Rso (Ω·cm) | Rsho (Ω·cm) |
|---|---|---|---|---|---|---|---|---|---|---|---|---|
| 1 | As dep | 0.430 | 0.516 | −30.62 | −13.166 | 57.59 | 9.103 | 0.404 | −22.52 | 9.103 | 2.431 | 71.79 |
| 2 | As dep | 0.430 | 0.532 | −31.34 | −13.475 | 67.76 | 11.293 | 0.423 | −26.69 | 11.293 | 1.962 | 242.87 |
| 3 | As dep | 0.430 | 0.516 | −30.84 | −13.262 | 50.33 | 8.005 | 0.384 | −20.85 | 8.005 | 2.625 | 50.65 |
| 4 | As dep | 0.430 | 0.540 | −30.97 | −13.316 | 70.91 | 11.862 | 0.433 | −27.39 | 11.862 | 1.814 | 805.79 |
| 5 | As dep | 0.430 | 0.542 | −30.04 | −12.916 | 71.08 | 11.576 | 0.433 | −26.73 | 11.576 | 1.703 | 966.72 |
| 6 | As dep | 0.430 | 0.548 | −30.19 | −12.983 | 71.47 | 11.818 | 0.440 | −26.84 | 11.818 | 1.966 | 1062.24 |
| 7 | As dep | 0.430 | 0.563 | −30.98 | −13.323 | 72.54 | 12.647 | 0.453 | −27.91 | 12.647 | 1.620 | 1119.81 |

Figure 9:
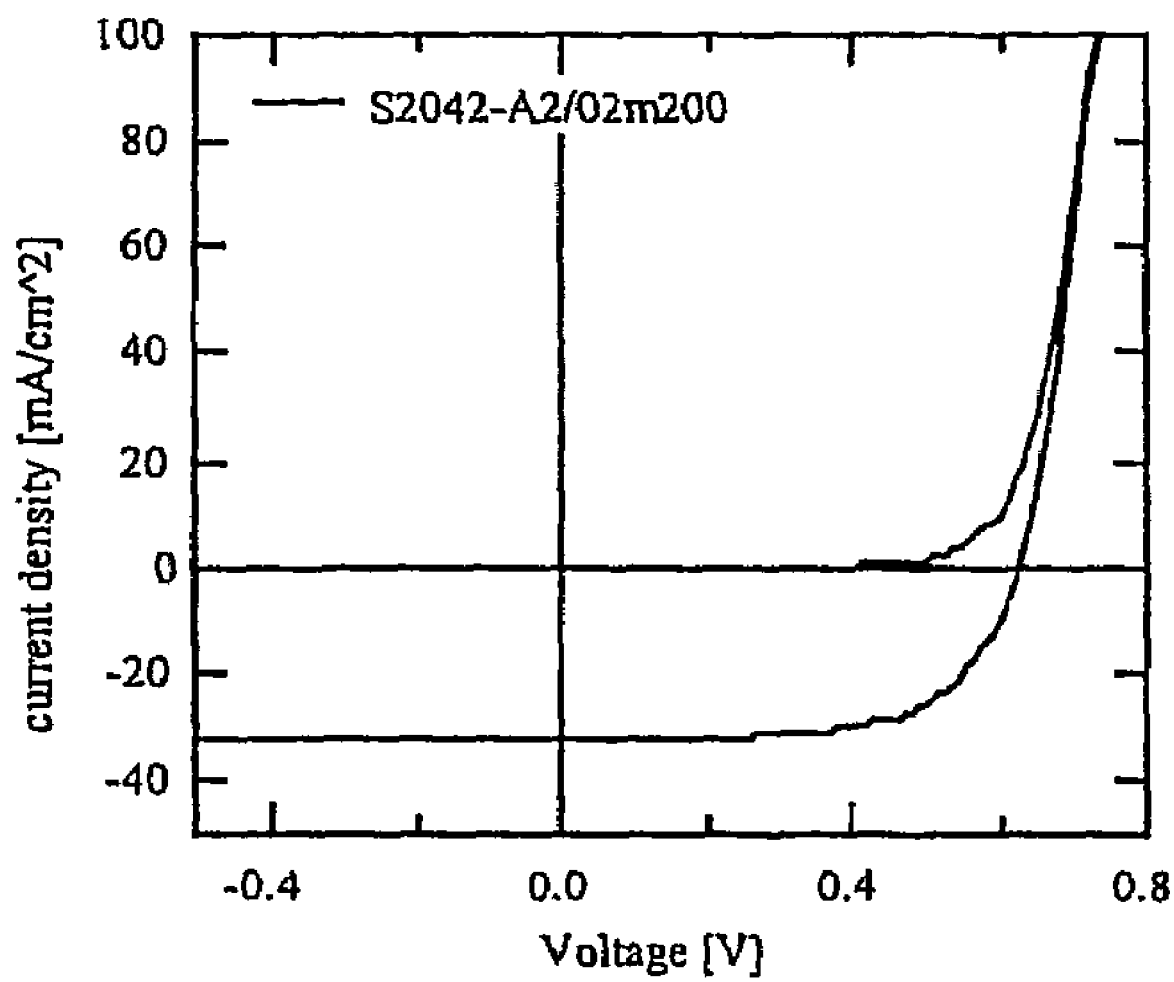
FIG. 9 is a graph showing I-V curves using essentially the same criteria as FIGS. 8A through 8F, but has an efficiency of 13.1%, an open current voltage of 0.627V, a current density of 32.8 mA/cm$^2$, and a fill factor of 64%.

FIG. 9 is a graph showing I-V curves using essentially the same criteria as FIGS. 8A through 8F, but has an efficiency Although certain preferred embodiments have been described and shown in the examples and the accompanying drawings, it is to be understood that these embodiments are merely illustrative of and not restricted to the invention scope and various modifications and changes may occur to those of ordinary skill in the art without departing from the spirit and scope of the invention, which is described hereinafter in the affixed claims.

The invention claimed is:

1. A process for making a thin film ZnO/Cu(InGa)Se$_2$ solar cell without depositing a buffer layer and by Zn doping from a vapor phase, comprising:
   a) depositing Cu(InGa)Se$_2$ layer on a metal back contact deposited on a glass substrate;
   b) heating the Cu(InGa)Se$_2$ layer on said metal back contact on said glass substrate to a temperature range between about 100° C. to about 250° C.;
   c) subjecting the heated layer of Cu(InGa)Se$_2$ to an evaporant species from Zn acetate dihydrate to dope the Cu(InGa)Se$_2$ with Zn and form a ZnO deposit and etching with acetic acid in an amount of 50% by volume in water to remove the ZnO deposit; and
   d) sputter depositing ZnO on the Zn acetate dihydrate evaporant species treated layer of Cu(InGa)Se$_2$.

2. The process of claim 1 wherein said metal back contact is Mo.

3. The process of claim 2 wherein in step c) the heated layer of Cu(InGa)Se$_2$ is subjected to said evaporant species from said zinc acetate dihydrate under a vacuum.

4. The process of claim 3 wherein the substrate temperature is about 100° C. during said heating.

5. The process of claim 4 wherein, prior to sputter depositing ZnO in step d) an annealing step is performed at a temperature range from about 150° C. to about 200° C.

6. The process of claim 3 wherein the substrate temperature is about 150° C. during said heating.

7. The process of claim 6 wherein, prior to sputter depositing ZnO in step d) an annealing step is performed at a temperature range from about 150° C. to about 200° C.

8. The process of claim 3 wherein the substrate temperature is about 200° C. during said heating.

9. The process of claim 8 wherein, prior to sputter depositing ZnO in step d) an annealing step is performed at a temperature range from about 150° C. to about 200° C.

10. The process of claim 3 wherein the substrate temperature is between 200° C. and 250° C. during said heating.

11. The process of claim 10 wherein, prior to sputter depositing ZnO in step d) an annealing step is preformed at a temperature range from about 150° C. to about 200° C.

* * * * *